United States Patent

Adolf

(10) Patent No.: US 10,992,375 B1
(45) Date of Patent: Apr. 27, 2021

(54) PHYSICAL ELECTROMAGNETICS SIMULATOR FOR DESIGN OPTIMIZATION OF PHOTONIC DEVICES

(71) Applicant: X Development LLC, Mountain View, CA (US)

(72) Inventor: Brian Adolf, San Mateo, CA (US)

(73) Assignee: X Development LLC, Mountain View, CA (US)

(*) Notice: Subject to any disclaimer, the term of this patent is extended or adjusted under 35 U.S.C. 154(b) by 0 days.

(21) Appl. No.: 16/738,727

(22) Filed: Jan. 9, 2020

Related U.S. Application Data

(62) Division of application No. 16/244,861, filed on Jan. 10, 2019, now Pat. No. 10,615,869.

(51) Int. Cl.
*H04B 10/077* (2013.01)
*G06F 30/367* (2020.01)
*G01R 29/08* (2006.01)

(52) U.S. Cl.
CPC ....... *H04B 10/0775* (2013.01); *G06F 30/367* (2020.01); *G01R 29/0814* (2013.01)

(58) Field of Classification Search
None
See application file for complete search history.

(56) References Cited

U.S. PATENT DOCUMENTS

| | | | |
|---|---|---|---|
| 5,774,693 A | 6/1998 | Hsu et al. | |
| 6,018,497 A * | 1/2000 | Gunasekera | G01V 1/50 367/72 |
| 6,106,561 A * | 8/2000 | Farmer | G01V 1/282 703/10 |
| 6,765,570 B1 * | 7/2004 | Cheung | G06T 15/08 345/420 |

(Continued)

FOREIGN PATENT DOCUMENTS

| | | |
|---|---|---|
| WO | 2017/176370 A1 | 10/2017 |
| WO | 2017/223560 A1 | 12/2017 |

OTHER PUBLICATIONS

Chen, R.T. et al., "Neural Ordinary Differential Equations", 32nd Conference on Neural Information Processing Systems (NIPS 2018), Oct. 22, 2018, 18 pages.

(Continued)

*Primary Examiner* — Darren E Wolf
(74) *Attorney, Agent, or Firm* — Christensen O'Connor Johnson Kindness PLLC

(57) ABSTRACT

A physical voxel, a volumetric testbed, and method for physically simulating a photonic device are described herein. The volumetric testbed comprises a simulation stage and a controller. The simulation stage includes a three-dimensional array of physical voxels configurable to represent the photonic device operating in response to electromagnetic radiation. The physical voxels includes a field detector to measure a local field response and an impedance adjuster to adjust an impedance to the electromagnetic (Continued)

radiation. The controller is coupled to memory, which stores instructions that when executed by one or more processors included in the controller causes the volumetric testbed to perform operations including determining a global field response of the photonic device and adjusting the impedance of the physical voxels to refine a design of the photonic device.

10 Claims, 3 Drawing Sheets

(56) References Cited

U.S. PATENT DOCUMENTS

| | | | |
|---|---|---|---|
| 6,772,076 B2 | 8/2004 | Yamamoto et al. | |
| 6,912,468 B2* | 6/2005 | Marin | G01V 1/28 702/14 |
| 7,098,908 B2* | 8/2006 | Acosta | G06T 15/08 345/419 |
| 7,248,258 B2* | 7/2007 | Acosta | G06T 15/08 345/419 |
| 9,570,812 B2 | 2/2017 | Driscoll et al. | |
| 9,589,757 B1 | 3/2017 | Hannon et al. | |
| 2004/0225483 A1 | 11/2004 | Okoniewski et al. | |
| 2010/0312539 A1 | 12/2010 | Yamagajo et al. | |
| 2011/0156720 A1* | 6/2011 | Di Stefano | G01R 31/1272 324/629 |
| 2011/0218775 A1* | 9/2011 | Czernuszenko | G06F 30/00 703/1 |
| 2013/0154581 A1* | 6/2013 | Ureel | H02J 5/005 320/167 |
| 2014/0365188 A1* | 12/2014 | Doerr | G06F 30/367 703/2 |
| 2016/0012176 A1 | 1/2016 | Liu et al. | |
| 2016/0033765 A1 | 2/2016 | Liu et al. | |
| 2016/0174902 A1 | 6/2016 | Georgescu et al. | |
| 2018/0018757 A1 | 1/2018 | Suzuki | |
| 2018/0045953 A1 | 2/2018 | Fan et al. | |

OTHER PUBLICATIONS

Petykiewicz, J. et al., "Active Nanophotonics: Inverse Design and Strained Germanium Light Emitters", A Dissertation Submitted to the Department of Electrical Engineering and the Committee on Graduate Studies of Stanford University, Oct. 2016. 134 pages.

Ying-Shou Lu, J., "Nanophotonic Computational Design", A Dissertation Submitted to the Department of Electrical Engineering and the Committee on Graduate Studies of Stanford University, Jun. 2013, 122 pages.

Piggott, A.Y., "Automated Design of Photonic Devices", A Dissertation Submitted to the Department of Electrical Engineering and the Committee on Graduate Studies of Stanford University, Jun. 2018, 112 pages.

Lu, J. et al., "Nanophotonic Computational Design", Optics Express, vol. 21, No. 11, Jun. 3, 2013, 17 pages.

Piggott, A. Y. et al., "Inverse Design and Implementation of a Wavelength Demultiplexing Grating Coupler", Scientific Reports, Nov. 27, 2014, 5 pages.

Piggott, A.Y. et al., "Inverse Design and Demonstration of a Compact and Broadband On-Chip Wavelength Demultiplexer", Nature Photonics, May 11, 2015, 5 pages.

Piggott, A.Y. et al., "Silicon Photonics: Design Approach to Integrated Photonics Explores Entire Space of Fabricable Devices", Laser Focus World, Aug. 13, 2018, 5 pages.

Piggott, A. Y. et al., "Fabrication-constrained Nanophotonic Inverse Design", Scientific Reports, May 11, 2017, 7 pages.

Su, L. et al., "Inverse Design and Demonstration of a Concept On-Chip Narrowband Three-Channel Wavelength Demultiplexer", ACS Photonics, Aug. 17, 2017, 6 pages.

Su, L. et al., Fully-Automated Optimization of Grating Couplers', Optics Express, vol. 26, No. 4m Feb. 2018, 12 pages.

Robinson, J.T., "First-Principle Derivation of Gain in High-Index-Contrast Waveguides", Optics Express, vol. 16, No. 21, Oct. 13, 2008, 11 pages.

Lalau-Keraly, C.M. et al., "Adjoint Shape Optimization Applied to Electromagnetic Design", Optical Society of America, 2013, 9 pages.

Tanaka, G. et al., "Recent Advances in Physical Reservoir Computing: A Review", arXiv:1808.04962v1, Aug. 15, 2018, 54 pages.

* cited by examiner

PHYSICAL ELECTROMAGNETICS SIMULATOR FOR DESIGN OPTIMIZATION OF PHOTONIC DEVICES

CROSS REFERENCE TO RELATED APPLICATION

The present application is a divisional of U.S. application Ser. No. 16/244,861, filed on Jan. 10, 2019, the contents of which are hereby incorporated by reference.

TECHNICAL FIELD

This disclosure relates generally to design tools, and in particular but not exclusively, relates to design tools for design optimization of photonic devices.

BACKGROUND INFORMATION

Photonic devices, such as optical and electromagnetic devices, are devices that create, manipulate, propagate, and/or measure electromagnetic radiation. Their applications vary broadly and include, but are not limited to, antennas, acousto-optic modulators, optical modulators, optical ring resonators, distributed Bragg reflectors, lasers, lenses, transistors, waveguides, and the like. Design of these devices is sometimes determined through a simple guess and check method in which a small number of design parameters of a pre-determined design are adjusted for suitability to a particular application. However, in actuality, these devices may have design parameters ranging from hundreds all the way to many billions, dependent on the device size and functionality. As functionality of these photonic devices is increased and manufacturing improves to allow for smaller device feature sizes, it becomes increasingly important to take full advantage of these improvements via optimized device design.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

DETAILED DESCRIPTION

Figure 1:
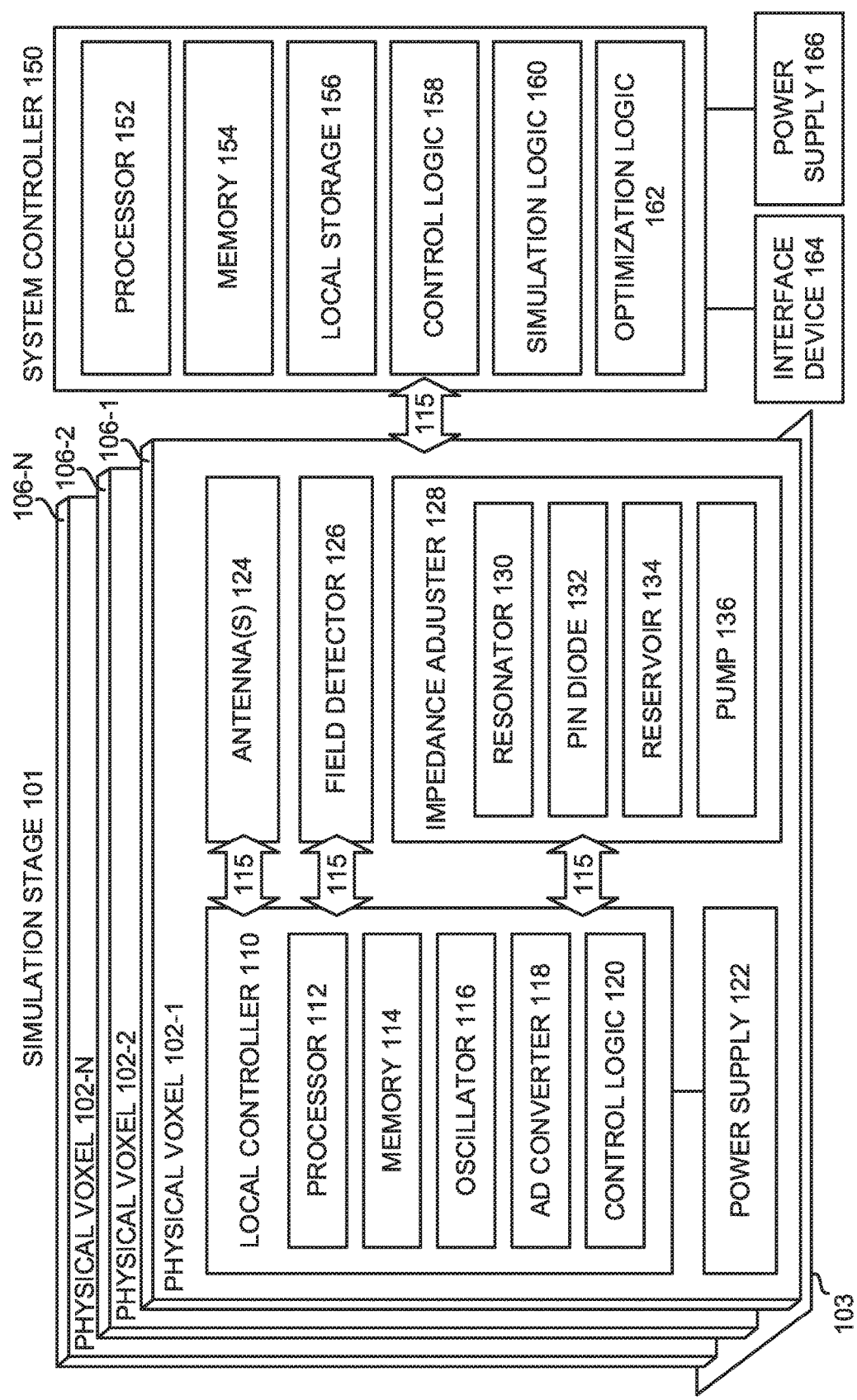
FIG. 1 is a functional block diagram illustrating a volumetric testbed for refining and optimizing a design of a photonic device, in accordance with an embodiment of the present disclosure.

Embodiments of a physical voxel, a volumetric testbed, and a method for physically simulating a photonic device to refine and optimize a design of the photonic device are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

One of the drawbacks with optimization of devices that are governed by Maxwell's equations is that the computational simulations are costly both in memory (e.g. RAM) and simulation time (e.g., floating point operations per second). However, rather than running software simulations that require massive amounts of compute for matrix inversion (e.g., for frequency domain approaches) or massive number of time steps (e.g., for time domain approaches), embodiments of a volumetric testbed for physically simulating devices are described herein. The volumetric testbed leverages the scale invariance of Maxwell's equations for refinement and optimization of photonic device designs, which may have various performance, time, and cost advantages compared to traditional simulators. Based on the scale invariance, larger devices operating at lower frequencies perform similarly to smaller devices operating at higher frequencies. Thus, embodiments described herein leverage the scale invariance to physically simulate photonic devices by operating at different scales (e.g., in physical dimensions and frequency).

In some embodiments, a volumetric testbed including a simulation stage having a plurality of physical voxels arranged to be representative of a photonic device operating in response to electromagnetic radiation is described. In the described embodiment, the physical voxels operate at a first frequency to physically simulate the photonic device operating at a second frequency that is different from the first frequency. Thus, the volumetric testbed physically simulates the photonic device with the physical voxels by scaling physical dimensions and operating frequencies of the photonic device. In one embodiment the first frequency is within a radio frequency (RF) band or range (e.g., approximately between 3 kHz to 300 GHz) and the second frequency is within an optical frequency band or range (e.g., approximately between 430 THz to 770 THz). Advantageously, the volumetric testbed may then utilize RF components for physically simulating the photonic device (e.g. an optical waveguide) operating within a non-RF frequency (e.g., the optical frequency band).

In the same or other embodiments, a design of the photonic device may be refined or optimized by performing a forward simulation followed by backpropagation via the physical voxels. The forward simulation and backpropagation are performed by transmitting electromagnetic radiation corresponding to an excitation source such as a transmitted source signal and/or a loss signal that propagates through a design region of the simulation stage represented by a portion of the physical voxels. The design region of the simulation stage is associated with the design of the photonic device being physically simulated. The portion of the physical voxels measures the electric and/or magnetic field vectors in one or more orthogonal directions for determining a global field response (e.g., from the source signal) or global loss response (e.g., from the loss signal) of the photonic device. The global field response and global loss response may be combined to determine an influence of changes to impedance to the electromagnetic radiation within each of the physical voxels. The impedance to the electromagnetic radiation within each of the physical voxels is based, at least in part, on a local material property of the individual physical voxels. The local material property may include index of refraction, dielectric constant, resonant frequency, and the like, and may be associated with the design of the photonic device. For example, a boundary defined by adjacent physical voxels having difference refractive indices may correspond to a material boundary within the photonic device. Thus, after determining the influence (e.g., sensitivity) of the impedance, the design (e.g., geometric boundaries described by interfaces where the material property of adjacent physicals voxels changes) of the photonic device may be refined and/or optimized to reduce the loss signal to have a performance parameter of the photonic device closer to a desired performance value.

FIG. 1 is a functional block diagram illustrating volumetric testbed 100 for refining and optimizing a design of a photonic device, in accordance with an embodiment of the present disclosure. In the following embodiments, the volumetric testbed 100 will be described in the context of an optical waveguide as corresponding to the photonic device being physically simulated. However, it is appreciated that the photonic device is not limited to optical waveguides, and that other photonic devices such as lasers, lenses, transistors, optical devices, quantum-dynamic devices, antennas, optoelectronic switches, mechanical structures, and the like may be represented by the term photonic device. In general, the term photonic device refers to components or devices for creating, manipulating, detecting, and/or emitting electromagnetic radiation. The volumetric testbed 100 provides first-principles based design, refinement, and optimization of photonic devices based on their optical, electrical, magnetic, acoustic, and/or fluidic response (e.g., field response) to an excitation source (e.g., at a source region). In other words, it is appreciated that the volumetric testbed 100 is not limited to physically simulating photonic devices but that other devices having a field response governed by scale invariant laws may be physically simulated and subsequently have their design refined and optimized.

In the illustrated embodiment, volumetric testbed 100 includes simulation stage 101 and system controller 150 coupled to interface device 164 and power supply 166. The simulation stage 101 includes a plurality of physical voxels 102 (e.g., physical voxel 102-1, physical voxel 101-2, up to physical voxel 101-N, where N corresponds to the total number of physical voxels within the simulation stage 101) and a baseplate 103. The physical voxels 102 are arranged in a three-dimensional array to physically simulate a photonic device. Each of the physical voxels 102 includes a local controller 110, power supply 122, antenna(s) 124, field detector 126, and impedance adjuster 128 disposed in or on the frame 106. The local controller 110 is coupled to power supply 122, antenna(s) 124, field detector 126, and impedance adjuster 128 via interconnect 115. Local controller 110 may include processor 112, memory 114, oscillator 116, analog-to-digital (AD) converter 118, and control logic 120 coupled to one another. Impedance adjuster 128 may include resonator 130 controlled by PIN diode 132 and/or a reservoir 134 controlled by pump 136. The system controller 150 is coupled to each of the physical voxels 102 and includes processor 152, memory 154, local storage 156, control logic 158 simulation logic 160, and optimization logic 162 coupled to one another.

Each of the physical voxels 102 is a controllable real-world (i.e., physical) voxel that may collectively be arranged in a pre-defined manner (e.g., as a three-dimensional array) to be representative of a photonic device being physically simulated. More specifically, each of the physical voxels 102 has a discrete shape provided by frame 106 and represents a unit spatial element of material property within the simulation stage 101. The frame 106 may define an overall shape of each of the physical voxels 102. The frame 106 may have a shape such that the individual voxels may be arranged or stacked within a three-dimensional array for physically simulating the photonic device. Various data and power connectors/links may be included in or on the frame 106 such that the individual physical voxels 106 may interface (e.g., communicate via the connectors) with other physical voxels, the baseplate 103, and/or system controller 150. The frame 106 may be comprised of a material substantially transparent to electromagnetic radiation (e.g., at one or more frequencies of interest). Baseplate 103 may represent a platform for which the physical voxels 102 may be placed upon. Power (e.g., wired or wirelessly) may be delivered to the physical voxels via the baseplate 103 which may be coupled to power supply 166.

Local controller 110 includes processor 112 coupled to memory 114 which may include instructions and/or logic (e.g., control logic 120) to choreograph operation of the individual physical voxels for physically simulating the photonic device. Each of the physical voxels 102 may be configured to transmit or receive electromagnetic radiation via antenna 124 operated via the local controller 110.

The electromagnetic radiation (e.g., corresponding to a source signal or a loss signal transmitted at a frequency of interest) may be locally sampled by field detector 126 and corresponds to a local field response or local loss response within the individual physical voxel. The field detector 126 is coupled to local controller 110 to measure the local field response and/or the local loss response (e.g., electric and/or magnetic field vectors locally in one or more directions, such as three orthogonal directions, as the electromagnetic radiation propagates through the simulation stage 101) at a corresponding one of the physical voxels 102. The field detector 126 may include a stub dipole antenna and/or a loop antenna to measure the electric and/or magnetic field vectors, respectively. The local field response and/or local loss response may be sampled at each of the physical voxels 102 directly if the sampling rate is high enough, or via mixing and down-conversion (e.g., heterodyning) in analog before the signal is sent to the AD converter 118 for processing. It is noted that each of the physical voxels 102 and corresponding local controller 110 may share a common phase reference, which may be provided by local oscillator signal 116 (e.g., provided by an oscillator locally located within the local controller 110, system controller 150, or otherwise). In other embodiments, the phase reference common to each of the physical voxels 101 may come from a wireless signal, GPS, optical signal, or the like.

Impedance adjuster 128 is configurable to change a material property of an individual one of the physical voxels 102 that may be controlled to adjust impedance to electromagnetic radiation within a corresponding one of the physical voxels 102. This may be accomplished by resonator 130 (e.g., split-ring resonator or otherwise) configurable by a PIN diode 132 to shift a resonance frequency of the resonator. Alternatively or in addition, the index of refraction of the individual physical voxels included in the physical voxels 102 may also be utilized to adjust the impedance. The index of refraction of an individual one of the physical voxels 102 may be controlled by a pump 136 operably coupled to a reservoir 134 that pumps in different fluids having different refractive indexes or other material properties (e.g., ferrofluid vs non-ferrofluid). In some embodiments, the reservoir may have a fixed and/or rigid shape that comprises the majority of the space of the individual physical voxels. In other embodiments, the reservoir is an expandable sack that changes size based on the amount of fluid within the sack.

Power supply 122 is coupled to local controller 110 to provide power to each of the physical voxels 102 for powering the various components. The power supply 122 may include charging circuitry such that the physical voxels 102 may be wirelessly charged. A battery or capacitor may be included within the power supply 122 to provide an energy storage element. Alternatively or in addition, the physical voxels 102 may be powered by a central power supply (e.g., provided by power supply 166 of system controller 150).

It is appreciated that each of the physical voxels 102 may not be identical in terms of components. Depending on the arrangement of the physicals voxels 102, certain physical voxels may have different roles or functionality within the simulation stage 101. In one embodiment, a first portion, a second portion, and a third portion of the physical voxels 102 (arranged as a three-dimensional array) may respectively be positioned within a source region, a design region, and a destination region of the simulation stage 101. The first and third portion of the physical voxels 102 arranged within the source region and destination region may be transceivers to both transmit and receive electromagnetic radiation. The physical voxels arranged within the design region may just be receivers and not need the necessary components for transmitting electromagnetic radiation. Similarly, in most embodiments, the impedance adjuster 128 may include either resonator 130 and pin diode 132 or reservoir 134 and pump 136, rather than both. By specifically catering the design of the individual physical voxels to the specified function of the physical voxel a significant manufacturing cost savings may be achieved.

System controller 150 orchestrates the operation of the volumetric testbed 100 for physically simulating the photonic device to refine and optimize a design of the photonic device. Processor 152 (e.g., one or more central processing units, graphics processing units, and/or tensor processing units, etc.), memory 154 (e.g., volatile memory such as DRAM and SRAM, non-volatile memory such as ROM, flash memory, and the like), local storage (e.g., magnetic memory such as computer disk drives), control logic 158, simulation logic 160, and optimization logic 162 are coupled to one another (e.g., via a communication bus). The system controller 150 includes software (e.g., instructions included in memory 154 coupled to processor 152) and/or hardware logic (e.g., application specific integrated circuits, field-programmable gate arrays, and the like) that when executed by the system controller 150, the local controller 110, and/or the volumetric testbed 100 causes the volumetric testbed 100 to perform operations. The operations may be based on any one of, or a combination of, instructions stored within or based on memory 114, memory 154, local storage 156, and/or logic (e.g., control logic 120, control logic 158, simulation logic 160, and optimization logic 162).

In the illustrated embodiment, control logic 158, simulation logic 160, and optimization logic 162 are utilized to physically simulate the photonic device to refine and optimize the design of the photonic device. The control logic 158 provides instructions for controlling or configuring the various components within the volumetric testbed 100. The simulation logic 160 provides instructions for physically simulating the photonic device, such as configuring individual physical voxels (e.g., as a phased array antenna) to transmit electromagnetic radiation having a specified waveform and spatial profile, measuring local field response and local loss response, etc. The optimization logic 162 provides instructions for refining and optimizing a design of the photonic device, such as adjusting an impedance of individual ones of the physical voxels 102 to reduce the loss signal.

System controller 150 is coupled to interface device(s) 164 to allow a user to interact with volumetric testbed 100, such as performing an initial configuration or set up of the simulation stage 101, adjusting parameters, settings, and/or material properties of the physical voxels 102 for physically simulating the photonic device, and/or viewing a status of the physical simulation. The interface device 164 may include a display (e.g., a light emitting diode display, a liquid crystal display, and the like) to display information to the user utilizing volumetric testbed 100, an input device (e.g., a mouse, trackball, keyboard, stylus, or other computer peripheral) to facilitate an interaction between the user and the volumetric testbed 100.

Figure 2A:
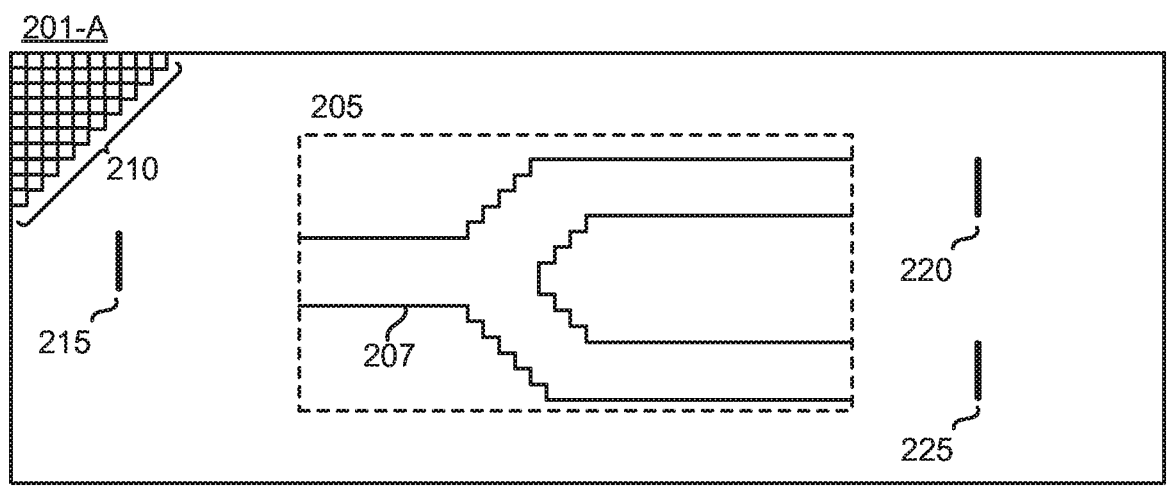
FIG. 2A illustrates an example of a simulation stage including a three-dimensional array of physical voxels arranged to physically simulate a photonic device, in accordance with an embodiment of the present disclosure.
Figure 2B:
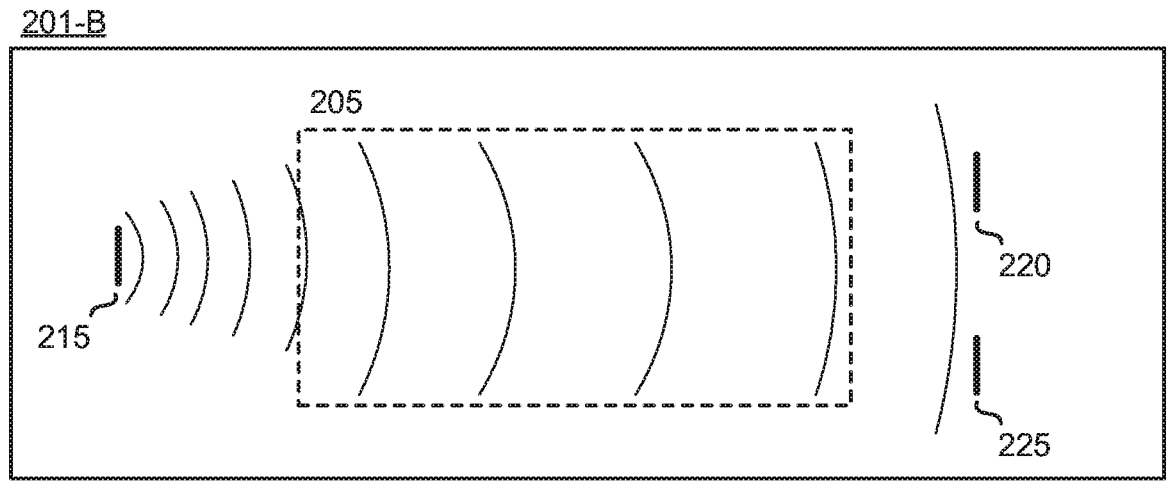
FIG. 2B illustrates performing a forward simulation of the photonic device via physical voxels, in accordance with an embodiment of the present disclosure.
Figure 2C:
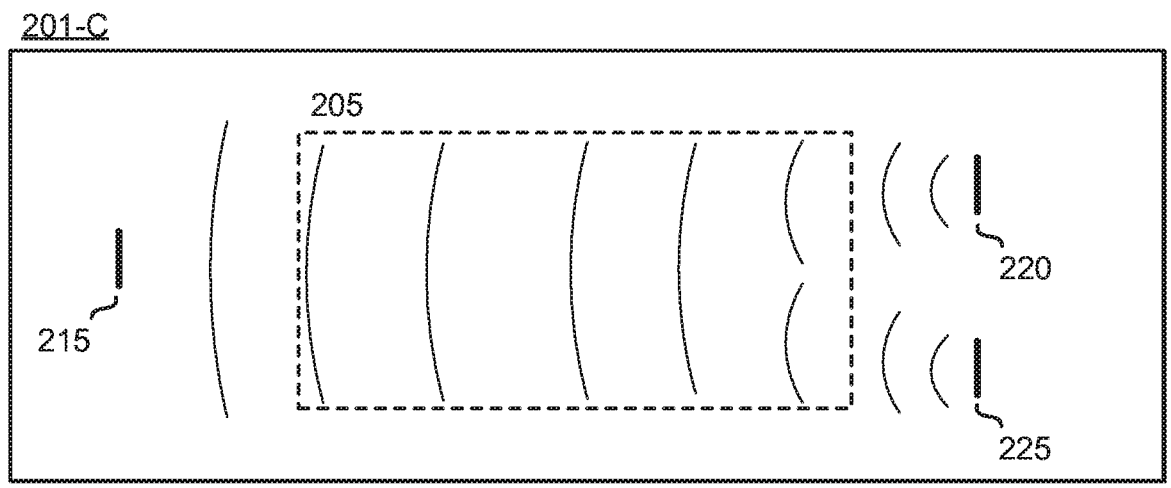
FIG. 2C illustrates performing a backward simulation of the photonic device via physical voxels, in accordance with an embodiment of the present disclosure.

FIGS. 2A-2C illustrate an initial set up and arrangement of the physical voxels 210 (e.g., the physical voxels 102 of FIG. 1) within a simulation stage 201 (e.g., the simulation stage 101 of FIG. 1) to physically simulate a photonic device, performing a forward simulation (e.g., transmitting electromagnetic radiation from a source region), performing a backward simulation (e.g., transmitting electromagnetic radiation from a destination region) for physically simulating and subsequently refining and optimizing a design of the photonic device. The three-dimensional arrangement and set up of the physical voxels 210, forward simulation, backward simulation, refinement, and optimization of the photonic device may be achieved via the volumetric testbed 100 illustrated in FIG. 1. As illustrated in FIGS. 2A-2C, the environment 201 is represented in two-dimensions for the sake of clarity, however it is appreciated that physical voxels 210 are three-dimensional objects (e.g., a cube or other stackable volumetric shapes that may be defined by a frame of each of the physical voxels) that may have various arrangements within the simulation stage 201 (e.g., the physical voxels 210 may be arranged as a 100×100×100 three-dimensional array, or otherwise) to physically simulate the photonic device. It is further noted that only a portion of the physical voxels 210 are illustrated to avoid obscuring other aspects of the simulation stage 201.

FIG. 2A illustrates an example arrangement of a plurality of physical voxels (e.g., the physical voxels 101 illustrated in FIG. 1) to physically simulate the photonic device, in accordance with an embodiment of the present disclosure. The simulation stage 201-A represents the simulation stage 201 at an initial set point or configuration state for physically simulating the photonic device. The physical voxels 210 are arranged within the simulation stage and are representative of the photonic device. In one embodiment, the physical voxels 210 are arranged to physically simulate an optical waveguide. Thus, within the simulation stage 201, the physical voxels 210 provide a scaled-up representation of the optical waveguide. More specifically, the physical voxels 210 operate at a first frequency (e.g., one or more frequencies within the RF range) to physically simulate the optical waveguide operating at a second frequency (e.g., one or more frequencies within the optical range).

In the illustrated embodiment, the simulation stage 210 includes a design region 205 positioned between a source region 215 and destination regions 220/225. A first portion (e.g., predetermined number) of the physical voxels 210 is positioned within the source region 215 and may correspond to an input port of the optical waveguide. A second portion (e.g., predetermined number) of the physical voxels 210 may be positioned within the design region 205 and is associated with a design of the optical waveguide. For example, physical voxels included in the second portion may be configured (e.g., via impedance adjuster 128 of FIG. 1) such that there are material property (e.g., index or refraction, resonant frequency, dielectric constant) boundaries 207 that are associated with the design (e.g., geometric structure) of the optical waveguide that may be refined and/or optimized. A third portion of the physical voxels 210 is positioned within the destination regions 220/225 and may correspond to a first and second output port of the optical waveguide. The arrangement of the physical voxels 210 may also include updating or configuring a material property (e.g., index of refraction, resonant frequency, dielectric constant, or the like) of each of the physical voxels 210 to define/describe an initial design of the photonic device (e.g., a hardware descriptor of the optical waveguide).

The source region 215 may correspond to an excitation source and be configured to transmit a source signal of electromagnetic radiation (e.g., a gaussian pulse, a wave, a waveguide mode, and the like) having a specified spatial profile at one or more frequencies of interest (e.g., the first frequency) that is directed towards the destination regions 220/225. The destination regions 220/225 may be used for determining a performance parameter or metric of the photonic device in response to the source signal. To refine or optimize a design of the optical waveguide, the destination regions 220/225 may also correspond to an excitation source and be configured to transmit a loss signal (e.g., based on the performance parameter or metric) of electromagnetic radiation towards the source region 215. The design region 205 is positioned between the source region 215 and the destination regions 220/225 and (in the case of an optical waveguide) guides the electromagnetic radiation from the source region 215 to the destination regions 220/225 (or vice versa in the case of the loss signal being transmitted from the destination region 220/225 to the source region 215). The electric and magnetic fields within the simulation stage 201 (and subsequently the photonic device) may change in response to the excitation source (e.g., source signal or loss signal), which may be measured by the physical voxels 210 to determine a global field response and/or global loss response of the photonic device for optimizing the design of the photonic device.

FIG. 2B illustrates performing a forward simulation of the photonic device via the physical voxels 210, in accordance with an embodiment of the present disclosure. During the forward simulation, the first portion of the physical voxels 210 (e.g., the source region 205 corresponding to an input port of the optical waveguide) is configured (e.g., as a phased-array antenna) to transmit electromagnetic radiation (e.g., a source signal) towards the third portion of the physical voxels 210 (e.g., the destination regions 220/225 corresponding to the first and second output port of the optical waveguide). In the case of an optical waveguide being physically simulated, the electromagnetic radiation is guided, at least in part, from the source region 215 to the destination regions 220/225 via the design region 205.

While the electromagnetic radiation is being transmitted from the source region 215, the global field response of the photonic device (e.g., the simulated optical waveguide) is determined by measuring a local field response (e.g., via field detector 126 of system 100 illustrated in FIG. 1) at each of the physical voxels 210 located within at least the design region 205 and the destination regions 220/225. It is noted that the local field response at an individual one of the physical voxels 210 is based, at least in part, on the impedance of the individual voxel, and may be adjusted (e.g., via impedance adjuster 128 of volumetric testbed 100 illustrated in FIG. 1). The local field response at each of the physical voxels 210 may be measured or sampled in real-time, over a time period (e.g., until a steady state is reached, reduces to negligible values, or the forward simulation otherwise concludes), or for other durations to determine the global field response of the photonic device. The global field response is stored in memory (e.g., at memory 114, memory 154, or local storage 156 of the volumetric testbed 100 illustrated in FIG. 1) and a performance parameter or metric of the photonic device is determined. In the illustrated embodiment the performance parameter represents power (e.g., at one or more frequencies of interest, such as the first frequency) in the desired mode shape at the specific locations of the destination regions 220/225, which correspond to the output ports of the simulated optical waveguide.

Based, at least in part, on the performance metric a loss signal may be determined. The loss signal is representative of a difference or comparison between a measured performance parameter (e.g., power at destination regions 220/225) and a desired performance value (e.g., desired power in a desired mode shape at the output ports of the optical waveguide). The loss signal may be determined by a loss or objective function which describes the relationship between the performance parameter and the desired performance value. The loss signal may subsequently be utilized to perform a backward simulation for refining and optimizing the design of the photonic device (e.g., the simulated optical waveguide).

FIG. 2C illustrates performing a backward simulation of the photonic device via the physical voxels 210, in accordance with an embodiment of the present disclosure. During the backward simulation, the third portion of the physical voxels 210 (e.g., the destination regions 220/225 corresponding to the first and second output ports of the optical waveguide) is configured to transmit electromagnetic radiation (e.g., the loss signal) towards the first portion of the physical voxels 210 (e.g., the source region 215 corresponding to the input port of the optical waveguide). Alternatively, transmitting the loss signal from the destination regions 220/225 to the source region 215 may be considered as backpropagating the loss signal through the physical voxels 210. In the case of an optical waveguide being simulated, the electromagnetic radiation is guided, at least in part, from the destination regions 220/225 to the source region 215 via the design region 205.

While the electromagnetic radiation is being transmitted from the destination regions 220/225, the global loss response of the photonic device (e.g., the simulated optical waveguide) is determined by measuring a local loss response (e.g., via field detector 126 of volumetric testbed 100 illustrated in FIG. 1) at the physical voxels 210 positioned within at least the design region 205. It is noted that the local loss response is based, at least in part, on the impedance of the physical voxels 210 which may be adjusted (e.g., via impedance adjuster 128 of the volumetric testbed 100 illustrated in FIG. 1). The local loss response at each of the physical voxels 210 may be measured or sampled in real-time, over a time period (e.g., until a steady state is reached or reduces to negligible values), or for other durations to determine the global loss response of the photonic device and may be stored in memory (e.g., at memory 114, memory 154, or local storage 156 of volumetric testbed 100 illustrated in FIG. 1).

The global field response and the global loss response may then be combined to determine an influence to changes in the impedance at each of the physical voxels 210 (e.g., within the design region 205) to electromagnetic radiation at one or more frequencies of interest (e.g., the first frequency which is representative of the optical waveguide operating at the second frequency). Once the influence is known, a material property (e.g., index of refraction, resonant frequency, dielectric constant, or any other configurable material property that may influence the impedance of an incoming wave of electromagnetic radiation) of the physical voxels 210 may be changed to reduce the loss signal. Changing the material property of the one or more physical voxels 210 to adjust the wave impedance subsequently changes the design of the photonic device being simulated. Iterative cycles of performing the forward simulation, backward simulation, and impedance adjustment may be repeated to refine and optimize a design of the photonic device (e.g., the simulated optical waveguide).

Figure 3:
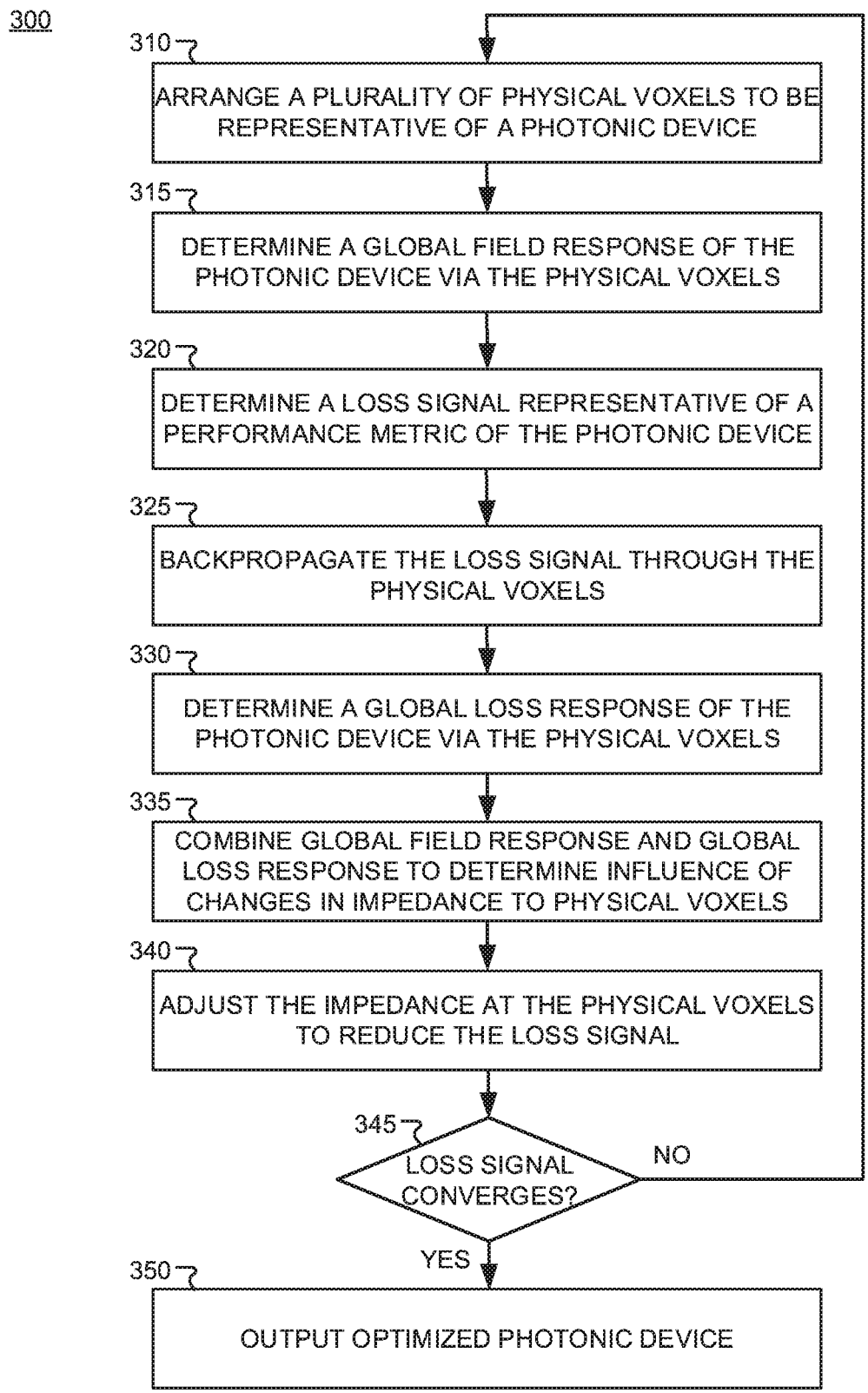
FIG. 3 illustrates a method for physically simulating a photonic device to refine and optimize a design of the photonic device, in accordance with an embodiment of the present disclosure.

FIG. 3 illustrates a method 300 for physically simulating a photonic device to refine and optimize a design of the photonic device, in accordance with an embodiment of the present disclosure. Method 300 is one possible implementation of simulating, refining, and optimizing a design of a photonic device via a physical electromagnetics simulator such as the volumetric testbed 100 illustrated in FIG. 1.

Referring back to FIG. 3, block 310 illustrates arranging physical voxels (e.g., physical voxels 102 illustrated in FIG. 1) within a simulation stage (e.g., the simulation stage 101 illustrated in FIG. 1) to be representative of a photonic device (e.g., an optical waveguide). Each of the physical voxels is a real-world physical voxel that collectively operates in response to electromagnetic radiation at a first frequency to physically simulate a photonic device operating at a second frequency different from the first frequency. In one embodiment, the first frequency may be one or more frequencies within the RF band (e.g., approximately between 3 kHz to 300 GHz) and the second frequency may be one or more frequencies within the optical band (e.g., approximately between 430 THz to 770 THz). In one embodiment, a first portion, a second portion, and a third portion of the physical voxels may be respectively arranged within a source region, a design region, and a destination region of a simulation stage to physically simulate the photonic device. It is noted that in some embodiments, each of the physical voxels is designed to have a material property responsive to electromagnetic radiation propagating through the physical voxel. In other words, the impedance to electromagnetic radiation propagating through the individual physical voxels may be configurable (e.g., via impedance adjuster 128 illustrated in FIG. 1). Furthermore, each of the physical voxels may have various functionalities to transmit, receive, and/or measure electromagnetic radiation. In one embodiment, the physical voxels disposed within the source region and destination region may be transceivers to both transmit and receive electromagnetic radiation, while the physical voxels disposed within the design region may just be receivers to measure electromagnetic radiation, but may not necessarily include the components for transmitting electromagnetic radiation. Arranging the physical voxels may include setting an initial parameter for material properties (e.g., index of refraction, resonant frequency, dielectric constant) of each of the physical voxels to define or describe an initial design and structure of the photonic device being physically simulated. This may correspond to uploading (e.g., via system controller 150 of FIG. 1) a hardware descriptor of the photonic device to be physically simulated.

After the physical voxels is arranged, a source waveform and corresponding spatial profile (e.g., a source signal at the source region which may correspond to an input of an optical waveguide being physically simulated) is defined. Similarly, an output waveform having a corresponding spatial profile and temporal profile at the destination region (e.g., an output signal at the destination region which may correspond to a first and second output of the optical waveguide being physically simulated) is also defined. The design region is also defined which corresponds to where the second portion of the physical voxels is placed. Furthermore, the physical voxels within the design region are configured (e.g., material property adjusted) to be representative of a design of the photonic device being simulated. In some embodiments, the design region may be configured to guide the source signal from the source region to the destination region. In some embodiments, dummy physical voxels that have the same sort of electrical and/or parasitic properties as the physical voxels may also be used to represent vacuum or any other constant electromagnetic property (e.g., in regions of the simulation stage outside of the source region, design region, and destination region). For example, in some embodiments, there may be a one or more regions (e.g., between the source region and the design region and/or design region and destination region) which are not desired to be changed/optimized, but may statically guide the radiation between the source and destination regions. In some embodiments, the physical electromagnetics simulator, volumetric testbed, and/or simulation stage may be enclosed within an anechoic chamber to reduce electromagnetic interference.

Block 315 shows determining a global field response of the photonic device by measuring a local field response at a corresponding one of the physical voxels for each of the physical voxels within at least the design region. To determine the global field response, a forward simulation is performed in which the first portion of the physical voxels (e.g., the source region) is configured to transmit electromagnetic radiation (e.g., the source signal). More specifically, the first portion of the physical voxels may be configured (e.g., via system controller 150, local controller 110, or a combination thereof as illustrated in FIG. 1) to apply a voltage waveform to individual physical voxels (e.g., local controller 110 applies the voltage waveform to antenna 124 illustrated in FIG. 1) included in the first portion of the physical voxels to collectively transmit the source signal (e.g., a source waveform). Thus, the individual voxels of the first portion of the physical voxels act as a phased array so that the local spatial profile, magnitude, and phase corresponds with the overall spatial profile defined for the input of the photonic device (e.g., the input of the simulated optical waveguide). In some embodiments, the first portion of the physical voxels (e.g., the source region of the photonic device) collectively act as a phased array antenna to direct the electromagnetic radiation through the second portion of the physical voxels (e.g., the design region of the photonic device) and towards the third portion of the physical voxels (e.g., the destination region of the photonic device).

In some embodiments, the phased array includes both dipole and loop antennas that may be able to respectively excite the electric field (intrinsically) and the magnetic field (intrinsically) at the physical voxels. Alternatively or in addition, the first portion of the physical voxels could be driven via the voltage waveforms to have a particular phase relationship to create a unidirectional source towards the destination region. Generally, the source region corresponding to a phased array of electric and/or magnetic dipoles that may be independently controllable with voltage and/or current sources (e.g., provided by local controller 110 illustrated in FIG. 1).

While transmitting the source signal, the global field response of the photonic device to the electromagnetic radiation (e.g., the source signal) is determined by measuring a local field response (e.g., via field detector 126 of FIG. 1) at each of the physical voxels within at least the design region when the electromagnetic radiation is propagating through the design region between the source region and the destination region (or otherwise being transmitted at the source region). In some embodiments, this includes measuring (e.g., picking up and recording) the electromagnetic signals, which corresponds to magnitude and phase information of the electromagnetic field proximate (i.e., local) to the individual physical voxels. More specifically, the electric and/or magnetic field vector components (e.g., in one or more directions, such as three orthogonal directions) is measured locally by each of the physical voxels within at least the design region of the photonic device. A local controller within the individual voxels (e.g., local controller 110 of FIG. 1) may have a corresponding number of channels on an AD converter (e.g., AD converter 118 of FIG. 1) that is mixed with a local oscillator signal (e.g., provided by oscillator 116 of FIG. 1) to sample, convert, and filter the received signal down to a baseband signal. In some embodiments, the signal will be received and/or recorded at a steady state, but in other embodiments the signal may be recorded as a function of time (e.g., until the received signal reaches a steady state, reduces to negligible values, or the forward simulation otherwise concludes).

Block 320 illustrates determining a loss signal representative of a performance metric or parameter of the photonic device. The loss signal may be based, at least in part, on a performance metric or parameter of the photonic device. In one embodiment, the loss signal is representative of a difference or comparison between a measured performance parameter (e.g., power at destination regions which may correspond to a first and second output port of a simulated optical waveguide) and a desired performance value (e.g., desired power in a desired mode shape at the output ports of the simulated optical waveguide).

Block 325 shows backpropagating the loss signal through the physical voxels. Backpropagation of the loss signal is part of a backward simulation of the photonic device to determine an influence of changes to the impedance at each of the physical voxels (e.g., within the design region) to the electromagnetic radiation. The loss signal is backpropagated through the design region between the destination region and the source region by transmitting the loss signal (e.g., via antenna(s) 124 included in the physical voxels 101 of FIG. 1) with a third portion of the physical voxels disposed within the destination region.

Block 330 illustrates determining a global loss response of the photonic device via the physical voxels. The global loss response of the photonic device to the loss signal is determined by measuring (e.g., via a field detector such as field detector 126 of FIG. 1) a local loss response (e.g., electric and magnetic field vector components in one or more directions, such as three orthogonal directions) at the physical voxels (e.g., corresponding to the design region) when the loss signal is propagating through the design region between the destination region and the source region (or otherwise being transmitted at the destination region). The global loss response of the photonic device may be measured (e.g., sampled, picked-up, received, recorded, stored, etc.) via the physical voxels in a manner similar to the measurement of the global field response.

Block 335 shows combining the global field response and global loss response to determine an influence of changes in the impedance to the electromagnetic radiation for each of the physical voxels within at least the design region affects the loss signal. More specifically, the recorded or stored global field response and global loss response may be combined (e.g., at the local level for each of the physical voxels within the design region) to determine how changes to the wave impedance at the individual physical voxel level affects the loss signal.

Block 340 shows adjusting the impedance at the physical voxels to reduce the loss signal and thus refine the photonic device to have a measured performance parameter closer to a desired performance value. Since the influence of changes in the impedance is known after determining the global field response and the global loss response, the impedance may subsequently be adjusted via an impedance adjuster (e.g., impedance adjuster 128) to reduce the loss signal. Thus, adjusting the impedance of the physical voxels (e.g., within the design region) corresponds to generating a revised description of the photonic device that has been refined to reduce the loss signal. The impedance is adjusted by the impedance adjuster by changing or configuring a material property (e.g., index of refraction, resonant frequency, dielectric constant) of the individual physical voxels that influences incoming waves (e.g., electromagnetic radiation at one or more frequencies).

In one embodiment, the impedance may be adjusted by changing an index of refraction of a corresponding one of the physical voxels (e.g., the physical voxels within the design region). The index of refraction may be changed by pumping in different fluids into a reservoir operably coupled to a pump included in each of the physical voxels corresponding to at least the design region of the photonic device. In the same or other embodiments, the impedance may be adjusted by shifting a resonant frequency of a resonator (e.g., split-ring resonator or otherwise) included in each of the physical voxels corresponding to at least the design region of the photonic device. More specifically, in some embodiments, the resonator may be coupled to a PIN diode which is subsequently adapted to shift the resonant frequency of the resonator. The adjustment to the impedance within the design region corresponds to generating a revised description of the photonic device that has been refined to reduce the loss signal.

Block 445 illustrates determining whether the loss value substantially converges such that the difference between the performance parameter (e.g., the power at one or more output ports of the optical waveguide) and the desired performance value is within a threshold range (e.g., the device has been optimized). Iterative cycles of successively performing the forward simulation (e.g., transmitting the source signal, determining the global field response, determining the loss signal), performing the backward simulation (e.g., determining the global loss response), combining the global field response and the global loss response, and adjusting the impedance to reduce the loss signal may be performed. The cycles may iteratively reduce the loss signal or the loss signal otherwise converges to be within a threshold range (e.g., the design of the photonic device is optimized to perform as desired), which indicates that the device is refined or optimized.

In some embodiments, the loss value may be reduced using various optimization schemes such as gradient descent. These optimization schemes may be implemented at a local controller level (e.g., local controller 110 of FIG. 1), a system controller level (e.g., system controller 150 of FIG. 1), or a combination thereof.

Block 450 illustrates outputting an optimized photonic device in which the impedance has been adjusted such that the difference between the performance parameter and the desired performance value is within the threshold range.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A physical voxel, comprising:
   a frame adapted for stacking the physical voxel into a three-dimensional array with other instances of the physical voxel for physically simulating a photonic device;
   a field detector including an antenna to measure a local field response within the physical voxel;
   an impedance adjuster to adjust an impedance at the physical voxel to electromagnetic radiation; and
   a local controller coupled to the field detector and the impedance adjuster, wherein the local controller, the field detector, and the impedance adjuster are each respectively positioned in or on the frame, wherein the local controller includes memory storing instructions that when executed by the local controller causes the physical voxel to perform operations including:
      measuring the local field response at the physical voxel with the antenna; and
      adjusting the impedance of the physical voxel with the impedance adjuster.

2. The physical voxel of claim 1, wherein the impedance adjuster includes a resonator coupled to a PIN diode, wherein the PIN diode is adapted to shift a resonant frequency of the resonator to adjust the impedance to the electromagnetic radiation within the physical voxel.

3. The physical voxel of claim 1, further comprising:
   a reservoir operably coupled to a pump to pump in different fluids into the reservoir to change an index of refraction of the physical voxel, wherein the impedance adjuster is adapted to change the index of refraction of the physical voxel to adjust the impedance.

4. The physical voxel of claim 3, wherein the reservoir has a fixed shape.

5. The physical voxel of claim 3, wherein the reservoir is an expandable sack that changes size based on an amount of the different fluids that are within the reservoir.

6. The physical voxel of claim 1, wherein the antenna of the field detector is a stub dipole antenna to measure the local field response within the physical voxel, wherein the stub dipole antenna is adapted to measure an electric field vector in one or more orthogonal directions, and wherein the local field response corresponds to the electric field vector.

7. The physical voxel of claim 1, wherein the antenna of the field detector is a loop antenna to measure the local field response within the physical voxel, wherein the loop antenna is adapted to measure a magnetic field vector in one or more orthogonal directions, and wherein the local field response corresponds to the magnetic field vector.

8. The physical voxel of claim 1, further comprising a power supply including charging circuitry to wirelessly receive power.

9. The physical voxel of claim 1, further comprising a battery or a capacitor to provide an energy storage element for the physical voxel.

10. The physical voxel of claim 1, further comprising an oscillator coupled to the local controller to provide a local oscillator signal.

\* \* \* \* \*